(12) United States Patent
Cho et al.

(10) Patent No.: US 12,219,699 B2
(45) Date of Patent: *Feb. 4, 2025

(54) FLEXIBLE CIRCUIT BOARD, COF MODULE, AND ELECTRONIC DEVICE COMPRISING THE SAME

(71) Applicant: LG INNOTEK CO., LTD., Seoul (KR)

(72) Inventors: Seung Soo Cho, Seoul (KR); Hyung Kyu Yoon, Seoul (KR); Sung Min Chae, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 205 days.

This patent is subject to a terminal disclaimer.

(21) Appl. No.: 18/151,698

(22) Filed: Jan. 9, 2023

(65) Prior Publication Data

US 2023/0225048 A1 Jul. 13, 2023

(30) Foreign Application Priority Data

Jan. 7, 2022 (KR) ........................ 10-2022-0002989

(51) Int. Cl.
*H05K 1/02* (2006.01)
*H05K 1/11* (2006.01)

(52) U.S. Cl.
CPC ........... *H05K 1/0296* (2013.01); *H05K 1/028* (2013.01); *H05K 1/115* (2013.01)

(58) Field of Classification Search
CPC ....... H05K 1/0296; H05K 1/028; H05K 1/115
USPC ......................................................... 361/749
See application file for complete search history.

(56) References Cited

FOREIGN PATENT DOCUMENTS

KR 10-2008-0030397 A 4/2008

*Primary Examiner* — Andargie M Aychillhum
(74) *Attorney, Agent, or Firm* — Saliwanchik, Lloyd & Eisenschenk

(57) ABSTRACT

A flexible circuit board comprises a substrate on which a chip mounting area is defined, a circuit pattern disposed on the substrate, and a protective layer on the circuit pattern, and the circuit pattern includes a plurality of first circuit patterns, a plurality of second circuit patterns, and a plurality of dummy patterns, and the first circuit pattern includes a first pad part, a second pad part, and a first wiring part connected to the first pad part and the second pad part, and the second circuit pattern includes a third pad part, a fourth pad part, and a second wiring part connected to the third pad part and the fourth pad part, and a through hole is disposed in an inner region of the first circuit pattern.

20 Claims, 9 Drawing Sheets

FLEXIBLE CIRCUIT BOARD, COF MODULE, AND ELECTRONIC DEVICE COMPRISING THE SAME

CROSS-REFERENCE TO RELATED APPLICATION

This application claims priority to Korean Application No. 10-2022-0002989, filed Jan. 7, 2022, the disclosure of which is incorporated herein by reference in its entirety.

TECHNICAL FIELD

An embodiment relates to a flexible circuit board, a COF module, and an electronic device including the same. In detail, the flexible circuit board may be a flexible circuit board for COF.

BACKGROUND ART

Recently, various electronic products are thin, miniaturized, and lightened. Accordingly, a research for mounting a semiconductor chip at a high density in a narrow region of an electronic device is being conducted in various ways.

Among them, since a chip on film (COF) method uses a flexible substrate, the COF method may be applied to both a flat panel display and a flexible display. That is, since the COF method may be applied to various wearable electronic devices, the COF method is attracting attention. In addition, since the COF method may realize a fine pitch, the COF method may be used to realize a high-resolution display (QHD as the number of pixel increases.

A chip on film (COF) is a method in which a semiconductor chip is mounted on a flexible circuit board in the form of a thin film. For example, the semiconductor chip may be an integrated circuit (IC) chip or a large scale integrated circuit (LSI) chip.

Meanwhile, the chip may be connected to an external PCB and a display panel through a circuit pattern. For example, a pad part is disposed at one end and the other end of the circuit pattern, respectively. One pad part is electrically connected to the terminal of the chip, and the other pad part is connected to the terminals of the PCB and the display panel. Accordingly, the chip, the PCB, and the display panel may be electrically connected through the COF. Therefore, a signal is transmitted to the display panel through the circuit pattern.

That is, the COF (Chip On Film) chip may be disposed on a metal terminal and connected to an external PCB and display panel.

The COF (Chip On Film) may generate heat in the chip during operation. The heat is transferred to the metal disposed under the chip and discharged to the outside. At this time, a protective layer for protecting the circuit pattern is disposed on top of the metal. The protective layer has low thermal conductivity. Accordingly, heat transferred to the metal is difficult to be discharged to the outside.

Accordingly, heat inside the COF may be accumulated and the internal temperature may increase. As a result, the chip may be damaged by heat.

Accordingly, a flexible circuit board having a new structure capable of solving the above problems is required.

DISCLOSURE

Technical Problem

An embodiment is to provide a flexible circuit board having improved reliability.

Technical Solution

A flexible circuit board comprises a substrate on which a chip mounting area is defined, a circuit pattern disposed on the substrate, and a protective layer on the circuit pattern, and the circuit pattern includes a plurality of first circuit patterns, a plurality of second circuit patterns, and a plurality of dummy patterns, and the first circuit pattern includes a first pad part, a second pad part, and a first wiring part connected to the first pad part and the second pad part, and the second circuit pattern includes a third pad part, a fourth pad part, and a second wiring part connected to the third pad part and the fourth pad part, and a through hole is disposed in an inner region of the first circuit pattern.

Advantageous Effects

A flexible circuit board according to an embodiment includes a through hole disposed on an area overlapping a circuit pattern. That is, the flexible circuit board according to the embodiment includes the through hole disposed in the inner region of the circuit pattern.

Accordingly, a heat generated in the chip moves along the circuit pattern. Also, the heat is discharged to the outside through the through hole. Therefore, it is possible to inhibit the internal temperature of the flexible circuit board from increasing. Accordingly, it is possible to inhibit a decrease in driving characteristics of the chip due to an increase in temperature.

Also, the through hole is disposed in the circuit pattern connected to the chip. Accordingly, the heat generated in the chip can be effectively discharged. That is, signals generated from the chip may move along the circuit pattern connected to the chip. Thus, heat moving along the circuit pattern can be effectively discharged.

In addition, the through holes may be formed in various sizes and numbers according to the line width of the circuit pattern. Also, the through hole may be formed at a larger interval among intervals of circuit patterns. Accordingly, the area of the through hole may be increased. Therefore, the speed at which heat is discharged can be improved.

MODES OF THE INVENTION

Hereinafter, embodiments of the present disclosure will be described in detail with reference to the accompanying drawings. However, the spirit and scope of the present disclosure is not limited to a part of the embodiments described, and may be implemented in various other forms, and within the spirit and scope of the present disclosure, one or more of the elements of the embodiments may be selectively combined and replaced.

In addition, unless expressly otherwise defined and described, the terms used in the embodiments of the present disclosure (including technical and scientific terms) may be construed the same meaning as commonly understood by one of ordinary skill in the art to which the present disclosure belongs, and the terms such as those defined in commonly used dictionaries may be interpreted as having a meaning that is consistent with their meaning in the context of the relevant art.

In addition, the terms used in the embodiments of the present disclosure are for describing the embodiments and are not intended to limit the present disclosure. In this specification, the singular forms may also include the plural forms unless specifically stated in the phrase, and may include at least one of all combinations that may be combined in A, B, and C when described in "at least one (or more) of A (and), B, and C".

Further, in describing the elements of the embodiments of the present disclosure, the terms such as first, second, A, B, (a), and (b) may be used. These terms are only used to distinguish the elements from other elements, and the terms are not limited to the essence, order, or order of the elements.

In addition, when an element is described as being "connected", "coupled", or "connected" to another element, it may include not only when the element is directly "connected" to, "coupled" to, or "connected" to other elements, but also when the element is "connected", "coupled", or "connected" by another element between the element and other elements.

Further, when described as being formed or disposed "on (over)" or "under (below)" of each element, the "on (over)" or "under (below)" may include not only when two elements are directly connected to each other, but also when one or more other elements are formed or disposed between two elements.

Furthermore, when expressed as "on (over)" or "under (below)", it may include not only the upper direction but also the lower direction based on one element.

Hereinafter, a flexible circuit board according to an embodiment, a COF module, and an electronic device including the same will be described with reference to the drawings.

Figure 1:
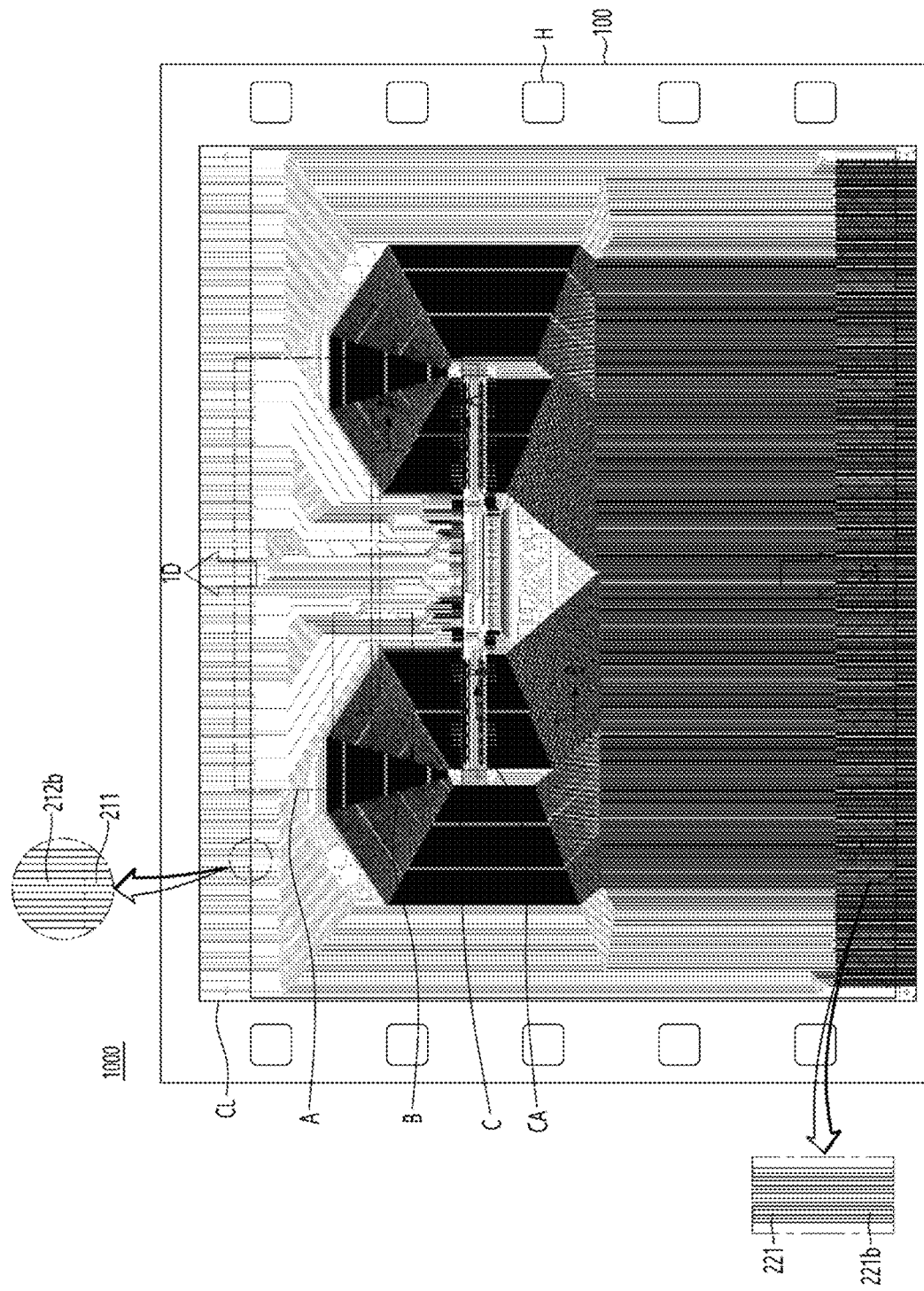
FIG. 1 a top view of a flexible circuit board according to an embodiment.

FIG. 1 is a top views of a flexible circuit board according to an embodiment.

Referring to FIG. 1, a flexible circuit board 1000 according to the embodiment includes a substrate 100 and a circuit pattern 200 disposed on the substrate 100.

The substrate 100 may include a flexible substrate. For example, the substrate 100 may be a polyimide (PI) substrate. However, the embodiment is not limited thereto. The substrate 100 may include a polymer material such as polyethylene terephthalate (PET), polyethylene naphthalate (PEN), or the like. Accordingly, the flexible circuit board may be used in various electronic devices having a curved display device. For example, the flexible circuit board including the substrate 100 is excellent in flexible characteristics. Accordingly, the semiconductor chip of the wearable electronic device can be easily mounted.

The substrate 100 may have a thickness of 20 μm to 100 μm. For example, the substrate 100 may have a thickness of 25 μm to 50 μm. For example, the substrate 100 may have a thickness of 30 μm to 40 μm. When the thickness of the substrate 100 exceeds 100 μm, the overall thickness of the flexible circuit board may increase. As a result, flexible characteristics may be reduced. In addition, when the thickness of the substrate 100 less than 20 μm, the substrate 100 may be damaged by heat and pressure generated during a chip mounting process.

The substrate 100 includes an effective area UA and a non-effective area UA. For example, the effective area AA may be a central area of the substrate 100. Also, the non-effective area UA may be an edge area of the substrate 100. The non-effective area UA may be disposed surrounding the effective area AA.

The effective area AA includes a chip mounting area CA. In detail, the chip mounting area CA is an area where the chip C connected to the circuit pattern is mounted.

In addition, circuit patterns 210 and 220 are disposed on the effective area AA. In detail, a plurality of circuit patterns spaced apart from each other and extending in multiple directions may be disposed in the effective area AA.

The effective area AA is an area actually used in the flexible circuit board 1000.

The circuit pattern is not disposed in the non-effective area UA. That is, the effective area AA and the non-active area UA may be distinguished by whether or not the circuit pattern is disposed.

The non-effective area UA includes a plurality of holes. In detail, the non-effective area UA includes a plurality of sprocket holes H. The flexible circuit board may be wound or unwound in a roll-to-roll manner through the sprocket hole H.

The non-active area UA is an area that is not actually used in the flexible circuit board 1000.

The flexible circuit board 1000 includes a cutting line CL defined as a boundary between the non-valid area UA and the effective area AA. A COF module may be manufactured by cutting along the cutting line CL.

The circuit pattern includes a wiring part and a pad part. Also, a plurality of circuit patterns may be disposed in the effective area AA. In detail, a first circuit pattern 210 and a second circuit pattern 220 may be disposed in the effective area AA.

Figure 2:
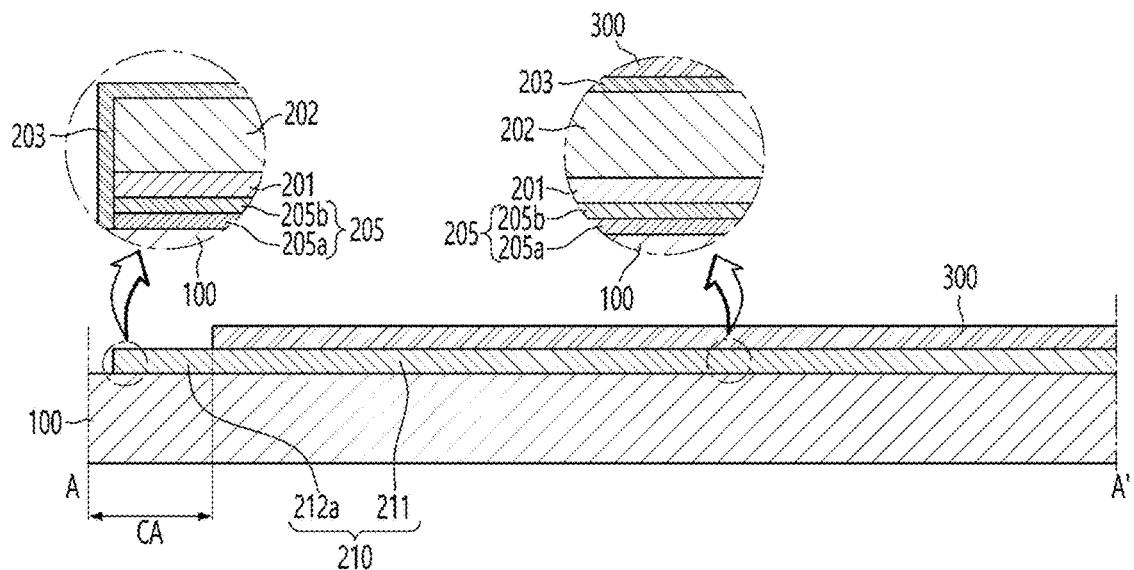
FIGS. 2 to 3 are cross-sectional views taken along line A-A' in FIG. 1.
Figure 3:
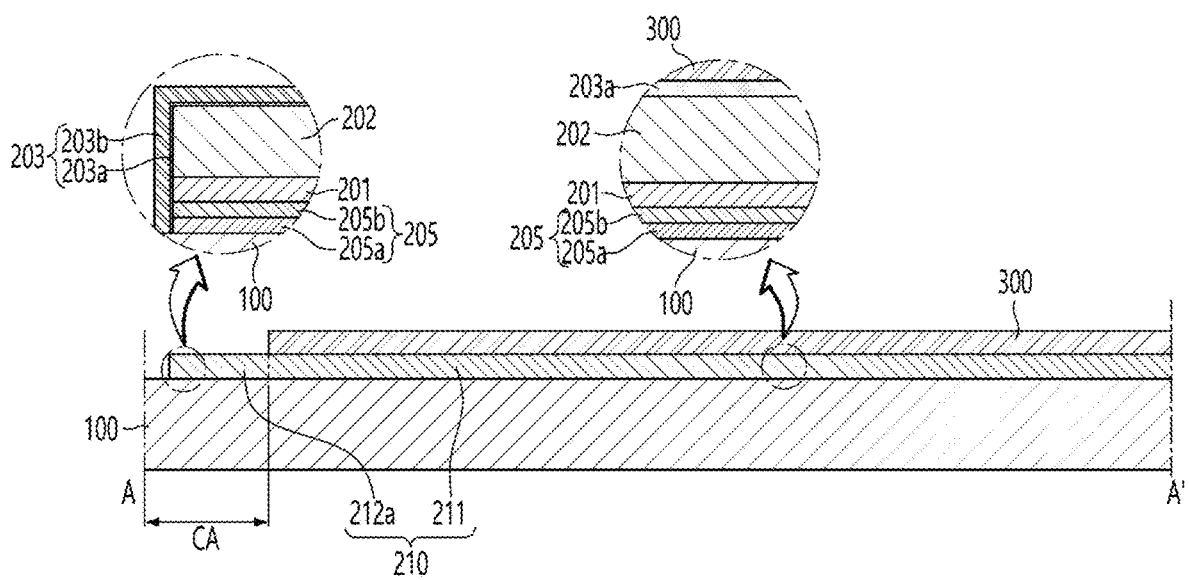

Referring to FIGS. 1 to 3, the first circuit pattern 210 may include a first wiring part 211, a first pad part 212a and a second pad part 212b. The first pad part 212a is disposed inside the chip mounting area CA. Also, the second pad part 212b is disposed outside the chip mounting area CA. In addition, the first wiring part 211 is disposed between the first pad part 212a and the second pad part 212b. The first wiring part 211 is connected to the first pad part 212a and the second pad part 212b.

The first wiring part 211, the first pad part 212a, and the second pad part 212b may be integrally formed.

Also, the first wiring part 211 may extend in a first direction 1D based on the chip mounting area CA.

The first pad part 212a may be electrically connected to a chip disposed in the chip mounting area. Also, the second pad part 212b may be electrically connected to the circuit board. Also, the first wiring part 211 may transfer a signal between the chip and the circuit board.

A protective layer 300 may be disposed on the first circuit pattern 210. In detail, the protective layer 300 may be disposed on the first wiring part 211. The protective layer 300 may be disposed while surrounding the first wiring part 211. In addition, the protective layer 300 may not be disposed on the first pad part 212a and the second pad part 212b.

That is, the first wiring part 211 is disposed below the protective layer 300. In addition, the first pad part 212a and the second pad part 212b may be exposed to the outside.

Figure 4:
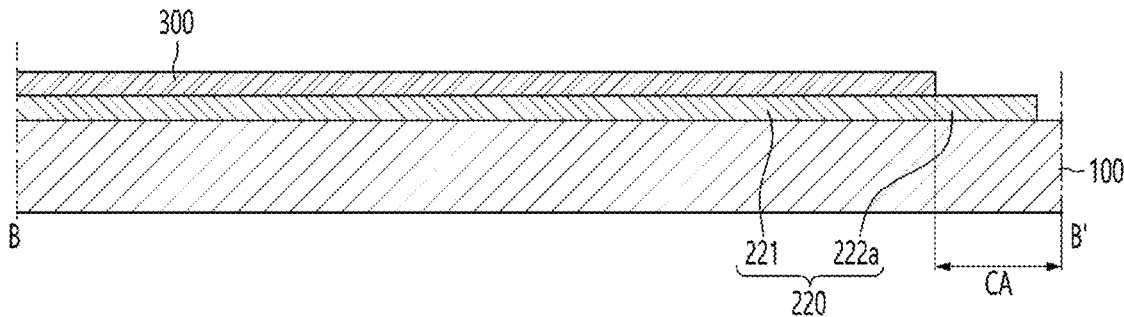
FIG. 4 is cross-sectional views taken along line B-B' in FIG. 1.

Also, referring to FIGS. 1 and 4, the second circuit pattern 220 may include a second wiring part 221, a third pad part 222a and a fourth pad part 222b. The third pad part 222a is disposed inside the chip mounting area CA. Also, the fourth pad part 222b is disposed outside the chip mounting area CA. In addition, the second wiring part 221 is disposed between the third pad part 222a and the fourth pad part 222b. Also, the second wiring part 221 is connected to the third pad part 222a and the fourth pad part 222b.

The second wiring part 221, the third pad part 222a, and the fourth pad part 222b may be integrally formed.

Also, the second wiring part 221 may extend in the second direction D2 based on the chip mounting area CA. The second direction D2 is opposite to the first direction 1D.

The third pad part 222a may be electrically connected to a chip disposed in the chip mounting area. Also, the fourth pad part 222b may be electrically connected to the display panel. Also, the second wiring part 221 may transmit a signal between the chip and the display panel.

The protective layer 300 may be disposed on the second circuit pattern 220. In detail, the protective layer 300 may be disposed on the second wiring part 221. The protective layer 300 may be disposed while surrounding the second wiring part 221. In addition, the protective layer 300 may not be disposed on the third pad part 222a and the fourth pad part 222b.

That is, the second wiring part 221 is disposed below the protective layer 300. Also, the third pad part 222a and the fourth pad part 222b may be exposed to the outside.

The first circuit pattern 210 and the second circuit pattern 220 may include a metal material having excellent electrical conductivity. In detail, the first circuit pattern 210 and the second circuit pattern 220 may include copper (Cu). However, the embodiment is not limited thereto. The first circuit pattern 210 and the second circuit pattern 220 may include at least one metal among copper (Cu), aluminum (Al), and chromium (Cr), nickel (Ni), silver (Ag), molybdenum (Mo), gold (Au), titanium (Ti), and an alloy thereof.

Referring to FIGS. 2 and 3, a layer structure of the circuit pattern of the flexible circuit board according to the embodiment will be described. In FIGS. 2 and 3, the first circuit pattern 210 will be mainly described. However, the embodiment is not limited thereto. The layer structure described in FIGS. 2 and 3 may be equally applied to the second circuit pattern 220.

Referring to FIG. 2, the first circuit pattern 210 may be formed in multiple layers. In detail, the first wire part 211 and the first pad part 212a may include a first metal layer 201 and a second metal layer 202. Also, although not shown in the drawings, the second pad part 212b may also include the first metal layer 201 and the second metal layer 202.

The first metal layer 201 may be a seed layer of the first circuit pattern 210. In detail, the first metal layer 201 may be a seed layer formed by electroless plating copper (Cu) disposed on the substrate 100.

Also, the second metal layer 202 may be a plating layer. In detail, the second metal layer 202 may be a plating layer formed by electroplating using the first metal layer 201 as a seed layer.

A thickness of the first metal layer 201 may be smaller than a thickness of the second metal layer 202.

For example, a thickness of the first metal layer 201 may be 0.7 μm to 2 μm. In addition, a thickness of the second metal layer 202 may be 10 μm to 25 μm.

The first metal layer 201 and the second metal layer 202 may include the same metal material. For example, the first metal layer 201 and the second metal layer 202 may include copper (Cu).

In addition, a bonding layer 203 may be disposed on the second metal layer 201. In detail, the bonding layer 203 may be disposed on a side surface of the first metal layer 201, a side surface of the second metal layer 202, and an upper surface of the second metal layer 202. That is, the bonding layer 203 may be disposed while surrounding the first metal layer 201 and the second metal layer 202.

The bonding layer 203 may include metal. In detail, the bonding layer 203 may include tin (Sn).

A thickness of the bonding layer 203 may be 0.3 μm to 0.7 μm. The bonding layer 203 may have a higher content of tin while extending from the lower surface to the upper surface. Here, the lower surface is a surface where the bonding layer 203 and the second metal layer 202 contact each other.

The bonding layer 203 is disposed in contact with the second metal layer 202. Accordingly, the bonding layer 203 may have a higher tin content and a lower copper content from the lower surface to the upper surface.

Accordingly, only pure tin may remain in the thickness range of 0.1 μm to 0.3 μm on the upper surface of the bonding layer 203.

The chip, the terminals of the circuit board, and the terminals of the display panel can be easily bonded through heat and pressure by the first pad part, the second pad part, and the bonding layer 203. That is, when heat and pressure are applied to the first pad part and the second pad part, the upper surface of the bonding layer where pure tin remains is melted. Accordingly, the chip, the terminals of the circuit board, and the terminals of the display panel can be easily bonded to the first pad part and the second pad part.

Accordingly, the bonding layer 203 is not separated from the first pad part 212a. That is, the bonding layer 203 may be a part of the first pad part 212a.

A thickness of the first circuit pattern 210 may be 2 μm to 25 μm. For example, the thickness of the first circuit pattern 210 may be 5 μm to 20 μm. For example, the thickness of the first circuit pattern 210 may be 7 μm to 15 μm.

A flash etching is performed on the first circuit patterns 210 to separate the circuit patterns during the manufacturing process. As a result, the first metal layer 201 is etched. As a result, the thickness of the finally formed first circuit pattern 210 and the second circuit pattern 220 may be smaller than the sum of the thicknesses of the first metal layer 201, the second metal layer 202, and the bonding layer 203.

When the thicknesses of the first circuit pattern 210 and the second circuit pattern 220 are less than 2 μm, the resistance of the first circuit pattern 210 and the second circuit pattern 220 may increase. When the thicknesses of the first circuit pattern 210 and the second circuit pattern 220 are exceeds 25 μm, it may be difficult to form a micropattern.

Meanwhile, a buffer layer 205 may be further disposed between the substrate 100 and the first circuit pattern 210. The buffer layer 205 may improve adhesion between the substrate 100 and the first circuit pattern 210.

The buffer layer 205 may be formed in multiple layers. In detail, a first buffer layer 205a and a second buffer layer 205b on the first buffer layer 205a may be disposed on the substrate 100. Accordingly, the first buffer layer 205a may contact the substrate 100. Also, the second buffer layer 205b may contact the first circuit pattern 201.

The first buffer layer 205a may include a material having good adhesion to the substrate 100. For example, the first buffer layer 205a may include nickel (Ni). In addition, the second buffer layer 205b may include a material having good adhesion to the first circuit pattern 210. For example, the second buffer layer 205b may include chromium (Cr).

The buffer layer 205 may have a thin film thickness in nanometers. For example, the buffer layer 205 may have a thickness of 20 nm or less.

Adhesion between the substrate 100 and the first circuit pattern 210 is improved by the buffer layer 205. Accordingly, it is possible to inhibit the first circuit pattern 201 from being filmed off.

Meanwhile, referring to FIG. 3, the bonding layer 203 may include a first bonding layer 203a and a second bonding layer 203b.

In detail, the first bonding layer 203a may be disposed on the first wiring part 211 and the first pad part 212a. Also, although not shown in the drawing, the first bonding layer 203a may also be disposed on the second pad part 212b. That is, the first bonding layer 203a may be disposed on the first circuit pattern 210.

In addition, the second bonding layer 203b may be disposed only on the first pad part 212a and the second pad part 212b. The first wiring part 211, the first pad part 212a, and the second pad part 212b may have different layer structures due to the second bonding layer 203b.

The first bonding layer 203a and the second bonding layer 203b may include metal. In detail, the first bonding layer 203a and the second bonding layer 203b may include tin (Sn).

The first bonding layer 203a and the second bonding layer 203b may have different thicknesses. In detail, the thickness of the second bonding layer 203b may be greater than that of the first bonding layer 203a.

For example, a thickness of the first bonding layer 203a may be of 0.02 μm to 0.06 μm. In addition, a thickness of the second bonding layer 203b may be 0.2 μm to 0.6 μm.

If the bonding layer between the protective layer 300 and the first wiring part 211 is thick, cracks may occur when the flexible circuit board is bent. Accordingly, the first bonding layer 203a is formed with a thin film thickness. Accordingly, it is possible to inhibit cracks from occurring when the flexible circuit board is bent.

In addition, the second bonding layer 203b may have a higher tin content while extending from the lower surface to the upper surface. The lower surface is a surface where the second bonding layer 203b and the first bonding layer 203a contact each other.

That is, the tin content of the second bonding layer 203b may increase and the copper content may decrease from the lower surface toward the upper surface.

Accordingly, only pure tin may remain in the thickness range of 0.1 μm to 0.3 μm on the upper surface of the second bonding layer 203b.

The chip, the terminals of the circuit board, and the terminals of the display panel can be easily bonded through heat and pressure by the first pad part, the second pad part, and the second bonding layer 203b. That is, when heat and pressure are applied to the first pad part and the second pad part, the upper surface of the second bonding layer where pure tin remains is melted. Accordingly, the chip, the terminals of the circuit board, and the terminals of the display panel can be easily bonded to the first pad part and the second pad part.

Accordingly, the first bonding layer 203a and the second bonding layer 203b are not separated from the first pad part 212a. That is, the first bonding layer 203a and the second bonding layer 203b may be a part of the first pad part.

Meanwhile, the protective layer 300 may be disposed on wiring parts of the first circuit pattern 210 and the second circuit pattern 220. In detail, the protective layer 300 may be disposed while surrounding the first wiring part 211 and the second wiring part 221. That is, the protective layer 300 is disposed on the first circuit pattern 210 and the second circuit pattern 220 except for the first pad part, the second pad part, the third pad part, and the fourth pad part.

The protective layer 300 may include solder paste. For example, the protective layer 300 may include a solder paste containing a thermosetting resin, a thermoplastic resin, a filler, a curing agent, or a curing accelerator.

Meanwhile, in the foregoing description, it has been described that the first circuit pattern 210 and the second circuit pattern 220 are disposed on the same surface of the substrate 100, but the embodiment is not limited thereto.

In detail, the first circuit pattern 210 and the second circuit pattern 220 may be disposed on the other side of the substrate 100. For example, the first circuit pattern 210 may be disposed on one surface of the substrate 100. In addition, the second circuit pattern 220 may be disposed on the other surface opposite to one surface of the substrate 100.

Accordingly, the display panel may be connected to the chip on one surface of the substrate 100. Also, the circuit board may be connected to the chip on the other surface of the substrate 100.

As described above, the chip is disposed on the flexible circuit board. The chip may be electrically connected to the circuit pattern.

The chip generates heat during operation. As a result, the temperature inside the flexible circuit board may be increased. Accordingly, the temperature inside the flexible circuit board may increase due to the heat. Also, driving characteristics of the chip may be reduced.

Hereinafter, a flexible circuit board capable of solving the above problems will be described.

Figure 5:
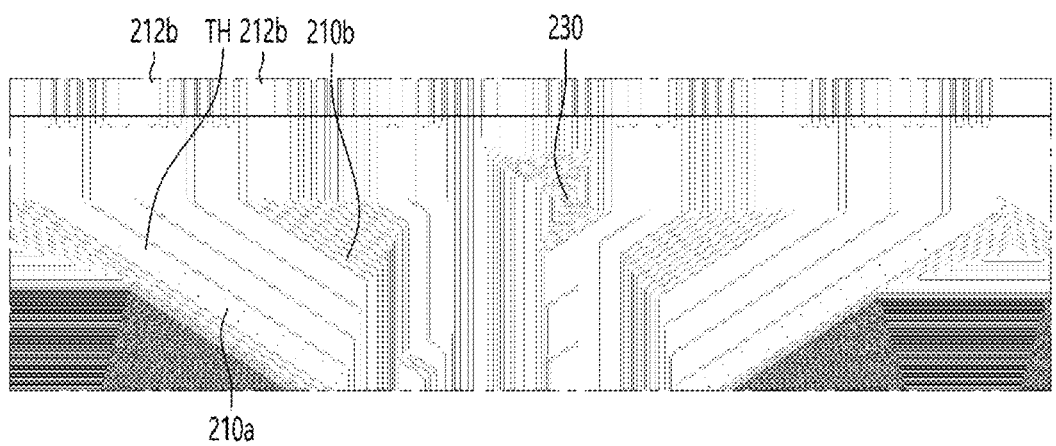
FIG. 5 is view showing an enlarged view of area A of FIG. 1.
Figure 6:
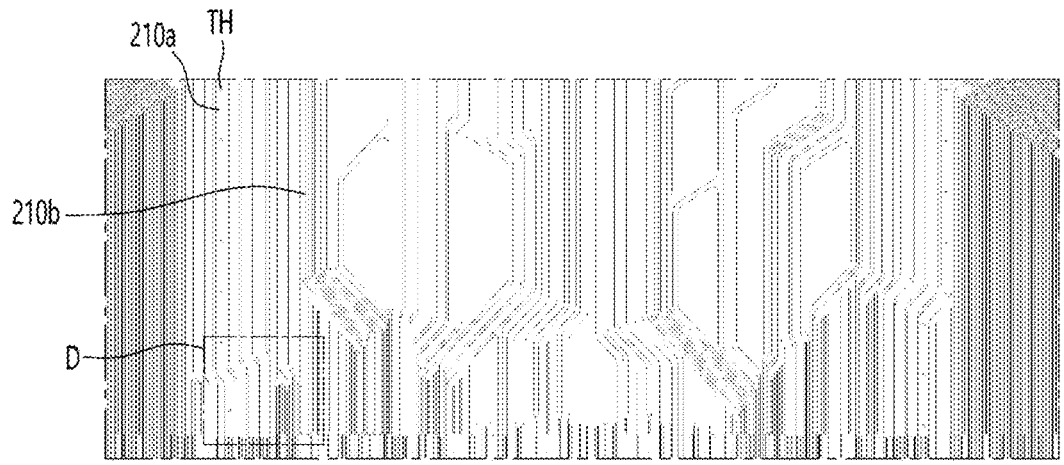
FIG. 6 is view showing an enlarged view of area B of FIG. 1.

FIGS. 5 and 6 are enlarged views of one area of FIG. 1.

Referring to FIGS. 5 and 6, the flexible circuit board according to the embodiment may include a through hole TH. The through hole TH may be formed at a position overlapping with at least one circuit pattern among a plurality of circuit patterns.

The through hole may pass through one surface and the other surface of the flexible circuit board. In detail, the through hole may be formed through the substrate 100, the circuit pattern, and the protective layer.

The flexible circuit board may include a plurality of circuit patterns. In detail, the circuit pattern may include a plurality of circuit patterns distinguished by whether or not they are connected to a chip.

In detail, the circuit pattern may include the first circuit pattern 210 and the second circuit pattern 220 described above. The first circuit pattern 210 and the second circuit pattern 220 are connected to a chip. That is, the first circuit pattern 210 and the second circuit pattern 220 are defined as circuit patterns in which signals move between the display panel, the circuit board, and the chip.

Also, the circuit pattern may include a dummy pattern 230. The dummy pattern 230 is not connected to a chip. That is, the dummy pattern 230 is not connected to the display panel, the circuit board, or the chip. That is, the dummy pattern 230 is defined as a circuit pattern in which signals of the display panel, the circuit board, and the chip do not move.

The through hole TH may be disposed on an area overlapping with at least one circuit pattern of the first circuit pattern 210 and the second circuit pattern 220. For example, the through hole TH may be disposed on an area overlapping the first circuit pattern 210. In detail, the through hole TH may be disposed on an area overlapping the first wiring part 211 of the first circuit pattern 210.

For example, the through hole TH is disposed in an inner region of the first circuit pattern 210. For example, the diameter of the through hole TH may be smaller than the line width of the first circuit pattern 210. Accordingly, the through hole TH may be surrounded by the first circuit pattern 210.

Alternatively, the diameter of the through hole TH may be the same as or similar to the line width of the first circuit pattern 210. Accordingly, the inner surface of the through hole TH may come into contact with the side surface of the first circuit pattern 210.

In addition, the first circuit pattern 210 may be disposed between adjacent through holes TH.

The first circuit pattern 210 may include a plurality of first circuit patterns 210 spaced apart from each other. The through hole TH may be disposed on an area overlapping with at least one first circuit pattern 210 among the plurality of first circuit patterns 210. The through hole TH may be disposed in an inner region of at least one first circuit pattern 210 among the plurality of first circuit patterns 210.

Accordingly, the first circuit pattern 210 may be distinguished into the 1-1 circuit pattern 210a that overlap with the through hole TH and the 1-2 circuit pattern 210b that does not overlap with the through hole TH. Thais is, the first circuit pattern 210 may be distinguished into the 1-1 circuit pattern 210a in which the through hole TH is disposed in the inner region and the 1-2 circuit pattern 210b in which the through hole TH is not disposed in the inner region.

The through hole TH may discharge heat from the flexible circuit board. That is, heat generated from the chip moves along the circuit pattern having a thermal conductivity within a set range. Accordingly, the heat may be discharged to the outside through the through hole. Accordingly, the flexible circuit board can inhibit an internal temperature of the flexible circuit board from being increased by the through hole.

Figure 7:
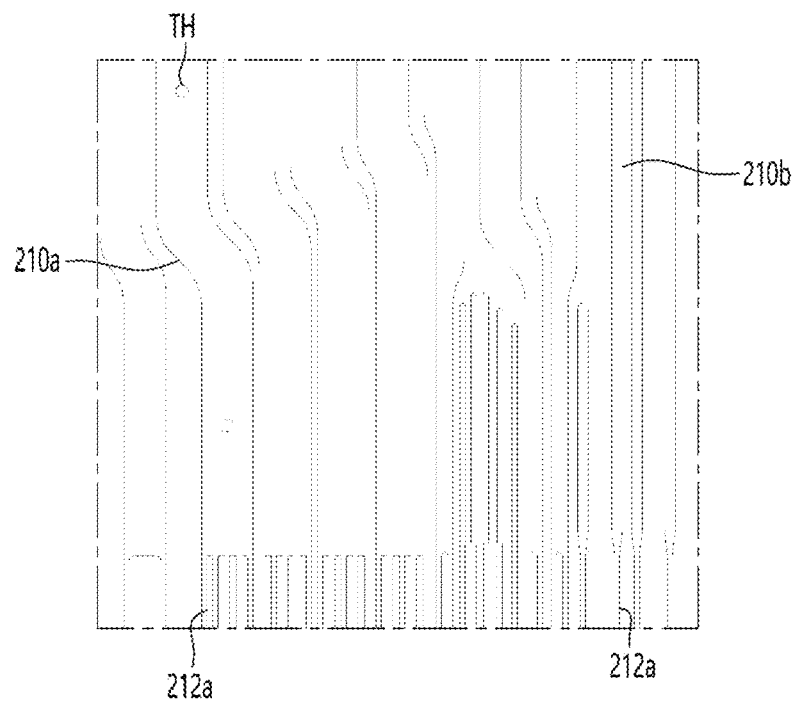
FIG. 7 is view showing an enlarged view of area D of FIG. 6.

Referring to FIGS. 5 to 7, the through hole TH may be disposed on an area overlapping the wide first circuit pattern 210 among the plurality of first circuit patterns 210. In detail, the through hole TH may be disposed in an inner region of the wide first circuit pattern 210 among the plurality of first circuit patterns 210. In detail, the first circuit pattern 210 may include a plurality of first circuit patterns having different widths. That is, the through hole TH may be disposed on an area overlapping the first circuit pattern 210 having a wider width than other first circuit patterns among the plurality of first circuit patterns. That is, the through hole TH may be disposed in an inner region of the first circuit pattern 210 having a wider width than other first circuit patterns.

That is, the line width of the 1-1 circuit pattern 210a may be larger than that of the 1-2 circuit pattern 210b. Also, the maximum line width of the 1-1 circuit pattern 210a may be greater than the maximum line width of the 1-2 circuit pattern 210b.

The first circuit pattern 210 may include at least one of the 1-1 circuit patterns 210a. For example, the first circuit pattern 210 may include a plurality of 1-1 circuit patterns 210a. The through hole TH may be disposed on an area corresponding to at least one 1-1 circuit pattern 210a.

The 1-1 circuit pattern 210a and the 1-2 circuit pattern 210b may be connected to different numbers of pad parts.

In detail, the number of first pad parts 212a connected to the 1-1 circuit pattern 210a may be different from the number of first pad parts 212a connected to the 1-2 circuit pattern 210b. In detail, the number of first pad parts 212a connected to the 1-1 circuit pattern 210a may be greater than the number of first pad parts 212a connected to the 1-2 circuit pattern 210b.

Also, the number of second pad parts 212b connected to the 1-1 circuit pattern 210a may be different from the number of second pad parts 212b connected to the 1-2 circuit pattern 210b. In detail, the number of second pad parts 212b connected to the 1-1 circuit pattern 210a may be greater than the number of second pad parts 212b connected to the 1-2 circuit pattern 210b.

For example, the 1-1 circuit pattern 210a may be electrically connected to a plurality of first pad parts 212a and a plurality of second pad parts 212b. Also, the 1-2 circuit patterns 210b may be electrically connected to one first pad part 212a and one second pad part 212b. That is, the 1-1 circuit pattern 210a may be a merge part connected to the plurality of first pad parts 212a and the plurality of second pad parts 212b.

Accordingly, the maximum line width of the 1-1 circuit pattern is greater than the maximum line width of the 1-2 circuit pattern. Accordingly, the 1-1 circuit pattern may be connected to a plurality of pad parts.

The line width of the 1-1 circuit pattern is larger than that of the 1-2 circuit pattern. Accordingly, the through hole TH can be easily formed on the 1-1 circuit pattern. That is, the through hole TH is disposed on an area overlapping the 1-1 circuit pattern having a large width. That is, the through hole TH is disposed in the inner region of the 1-1 circuit pattern having a large width. Accordingly, it is possible to inhibit the through hole TH from being formed outside the circuit pattern due to an error during the process.

Also, the through hole TH is disposed on an area overlapping the 1-1 circuit pattern having a large width. That is, the through hole TH is disposed in the inner region of the 1-1 circuit pattern having a large width. Accordingly, the size of the through hole TH may be increased. Since the size of the through hole is increased, heat generated from the flexible circuit board can be effectively discharged.

Figure 8:
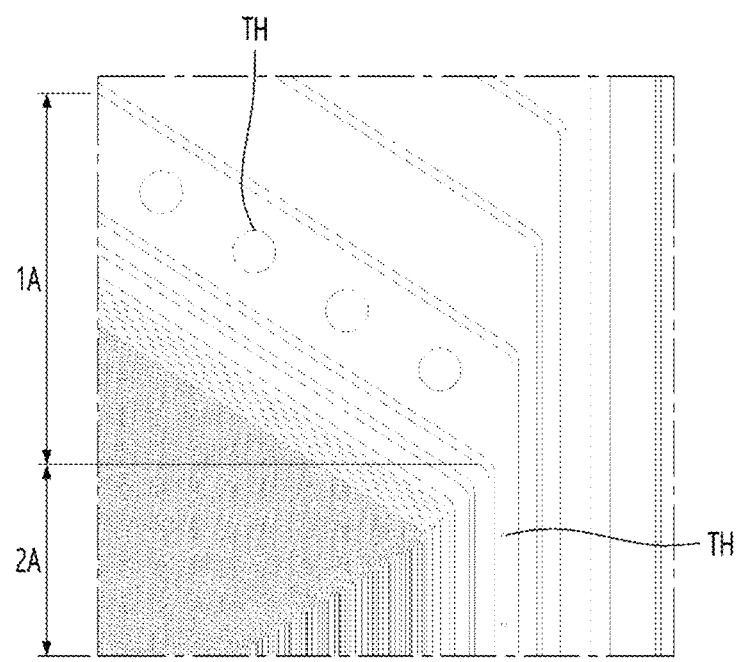
FIGS. 8 to 10 are view showing an enlarged views of area C of FIG. 1.
Figure 9:
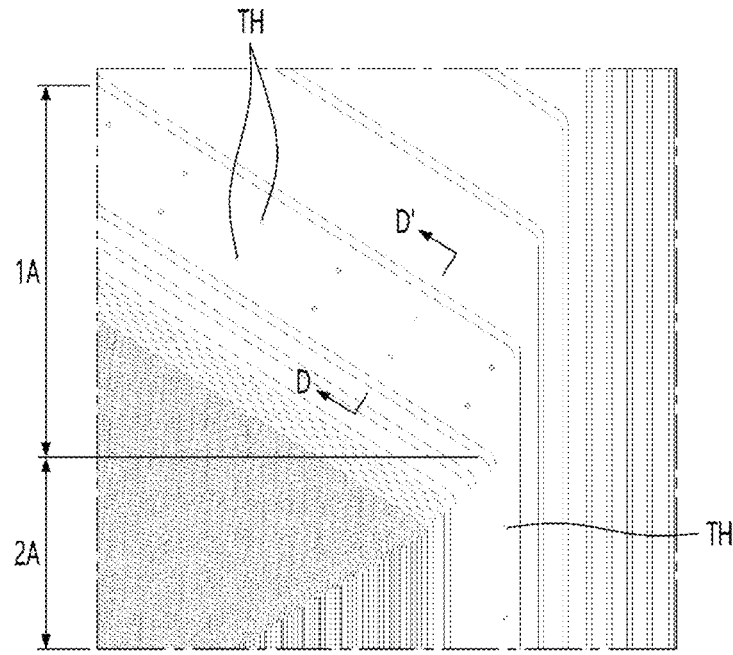
Figure 10:
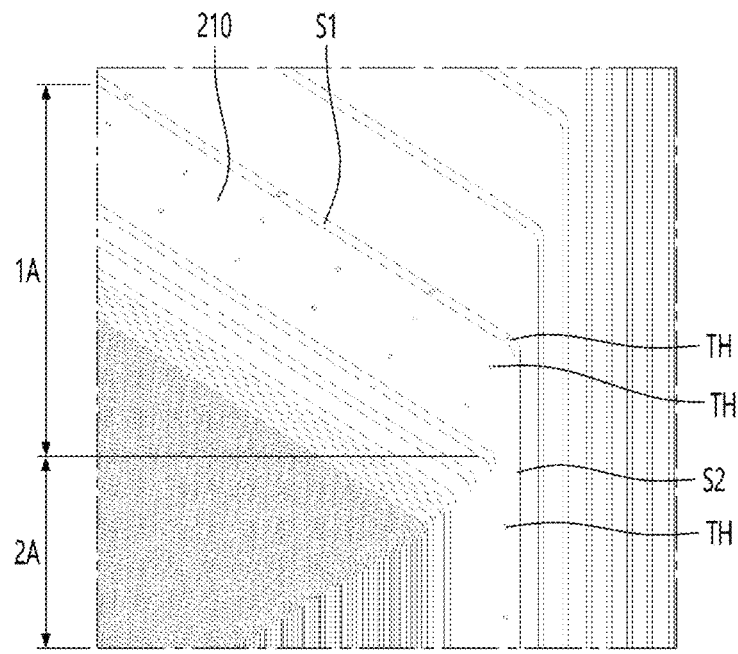

Referring to FIGS. 8 to 10, the through holes TH may be disposed in various sizes and in various numbers.

Referring to FIG. 8, the through hole TH may include a plurality of through holes having different sizes in the 1-1 circuit pattern 210a.

The 1-1 circuit pattern 210a may be defined as a plurality of regions according to a line width. In detail, the 1-1 circuit pattern 210a may include a first area 1A and a second area 2A. A line width of the first region 1A may be larger than that of the second region 2A.

A size of the through hole TH formed in the first area and a size of the through hole TH formed in the second area may be different. In detail, the size of the through hole TH formed in the first area may be larger than the size of the through hole TH formed in the second area. That is, the through hole formed in the first region having a larger line width than the second region may have a larger size.

Accordingly, an area where the through hole is formed may increase. As a result, heat generated from the flexible circuit board can be effectively discharged.

Referring to FIG. 9, the number of through holes per unit length of the first region 1A and the second region 2A may be different. In detail, the number of through holes per unit length of the first region 1A may be greater than the number of through holes per unit length of the second region 2A.

That is, a plurality of through holes spaced apart in the line width direction of the 1-1 circuit pattern 210a may be disposed in the first region 1A having a larger line width than the second region 2A. Accordingly, the number of through holes per unit length of the first region 1A may be greater than the number of through holes per unit length of the second region 2A. In detail, the area of the through hole per unit length of the first region 1A may be greater than the area of the through hole per unit length of the second region 2A.

Accordingly, the area of the through hole formed in the first region 1A may be increased. Therefore, heat generated from the flexible circuit board can be effectively discharged.

Referring to FIG. 10, the through hole TH may also be disposed at intervals between the first circuit patterns 210.

Intervals between the first circuit patterns 210 may be different for each position. For example, the first circuit patterns 210 may have a first interval s1 and a second interval s2. In detail, the first circuit pattern 210 may extend in multiple directions. The first interval s1 is defined as an interval between first circuit patterns extending from the second pad part in one direction toward the first pad part. Also, the second interval s2 is defined as an interval between first circuit patterns that are bent in one direction and extend in another direction. The first interval s1 and the second interval s2 may be different.

In detail, the first interval s1 may be greater than the second interval s2. That is, the first interval s1 of the first circuit patterns before the first circuit patterns are bent may be greater than the second interval s2 of the first circuit patterns after the first circuit patterns are bent.

The through hole TH may also be disposed in the interval s1. Accordingly, the area of the through hole formed in the flexible circuit board may be increased. Accordingly, heat generated from the flexible circuit board can be effectively discharged.

Sizes of the through holes formed in the first region, the second region, and the second interval may be different.

In detail, the size of the through hole formed in the first area may be larger than the size of the through hole formed in the second area and the size of the through hole formed in the second interval. Also, the size of the through hole formed in the second region may be greater than or equal to a size of the through hole formed in the second interval.

Alternatively, the size of the through hole formed in the first region and the through hole formed in the second region may be similar. In addition, Sizes of the through holes formed in the first area and the through holes formed in the second area may be equal to or greater than the sizes of the through holes formed in the second interval.

Figure 11:
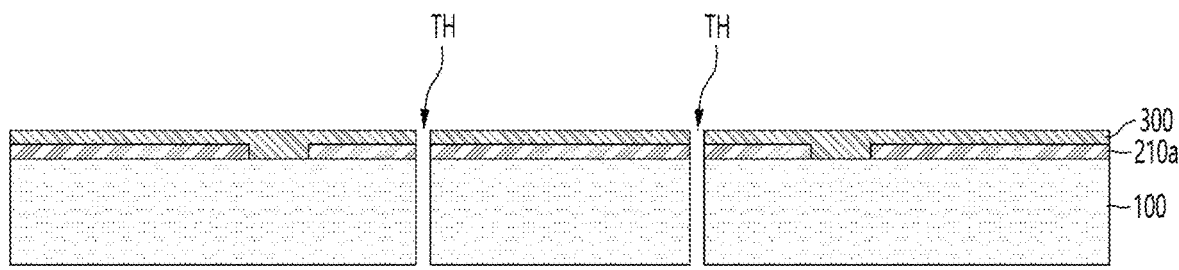
FIGS. 11 to 13 are cross-sectional views taken along line C-C' in FIG. 9.
Figure 12:
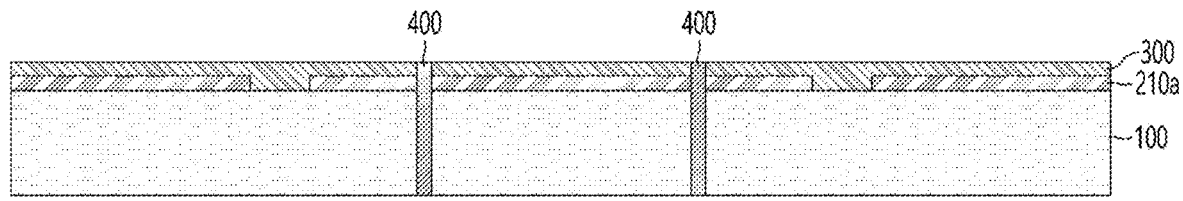
Figure 13:
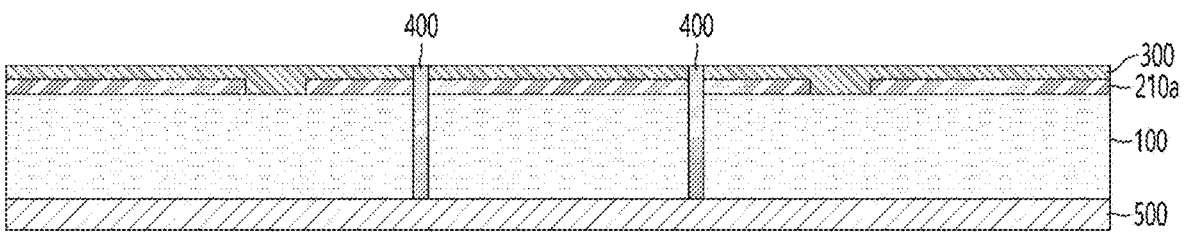

Referring to FIGS. 11 to 13, the through hole TH may be empty. Alternatively, the inside of the through hole TH may be filled with another material.

Referring to FIG. 11, the inside of the through hole TH may be empty. That is, side surfaces of the substrate 100, the circuit pattern, and the protective layer 300 may be exposed by the through hole TH.

Accordingly, heat generated in the chip may be discharged to the outside through the through hole.

Alternatively, referring to FIG. 12, a conductive material may be filled in the through hole TH. In detail, a conductive layer 400 including a metal material may be disposed inside the through hole TH. More specifically, copper may be filled in the through hole TH.

The conductive layer 400 may be disposed in contact with the circuit pattern.

Accordingly, heat generated in the chip moves along the circuit pattern. Also, the heat may be discharged to the outside through the conductive layer in contact with the circuit pattern.

Alternatively, referring to FIG. 13, the conductive material may be filled in the through hole TH. In detail, the conductive layer including a metal material may be disposed inside the through hole TH. More specifically, copper may be filled in the through hole TH.

In addition, a metal layer 500 may be disposed on the other surface of the substrate 100. That is, the metal layer 500 may be disposed on the other surface opposite to one surface of the substrate on which the first circuit pattern and the second circuit pattern are disposed.

The metal layer 500 may be disposed at a position overlapping the through hole TH. In addition, the metal layer 500 may be partially disposed on the other surface of the substrate. In addition, the metal layer 500 may be entirely disposed on the other surface of the substrate.

The metal layer 500 may be disposed in contact with the conductive layer disposed in the through hole TH.

Accordingly, heat generated in the chip moves along the circuit pattern. In addition, the heat may be discharged to the outside through the conductive layer and the metal layer in contact with the circuit pattern.

The flexible circuit board according to an embodiment includes a through hole disposed on the area overlapping the circuit pattern. That is, the flexible circuit board according to the embodiment includes the through hole disposed in the inner region of the circuit pattern.

Accordingly, the heat generated in the chip moves along the circuit pattern. Also, the heat is discharged to the outside through the through hole. Therefore, it is possible to inhibit the internal temperature of the flexible circuit board from increasing. Accordingly, it is possible to inhibit a decrease in driving characteristics of the chip due to an increase in temperature.

Also, the through hole is disposed in the circuit pattern connected to the chip. Accordingly, the heat generated in the chip can be effectively discharged. That is, signals generated from the chip may move along a circuit pattern connected to the chip. Thus, the heat moving along the circuit pattern can be effectively discharged.

In addition, the through holes may be formed in various sizes and numbers according to the line width of the circuit pattern. Also, the through hole may be formed at a larger interval among intervals of circuit patterns. Accordingly, the area of the through hole may be increased. Therefore, the speed at which heat is discharged can be improved.

Figure 14:
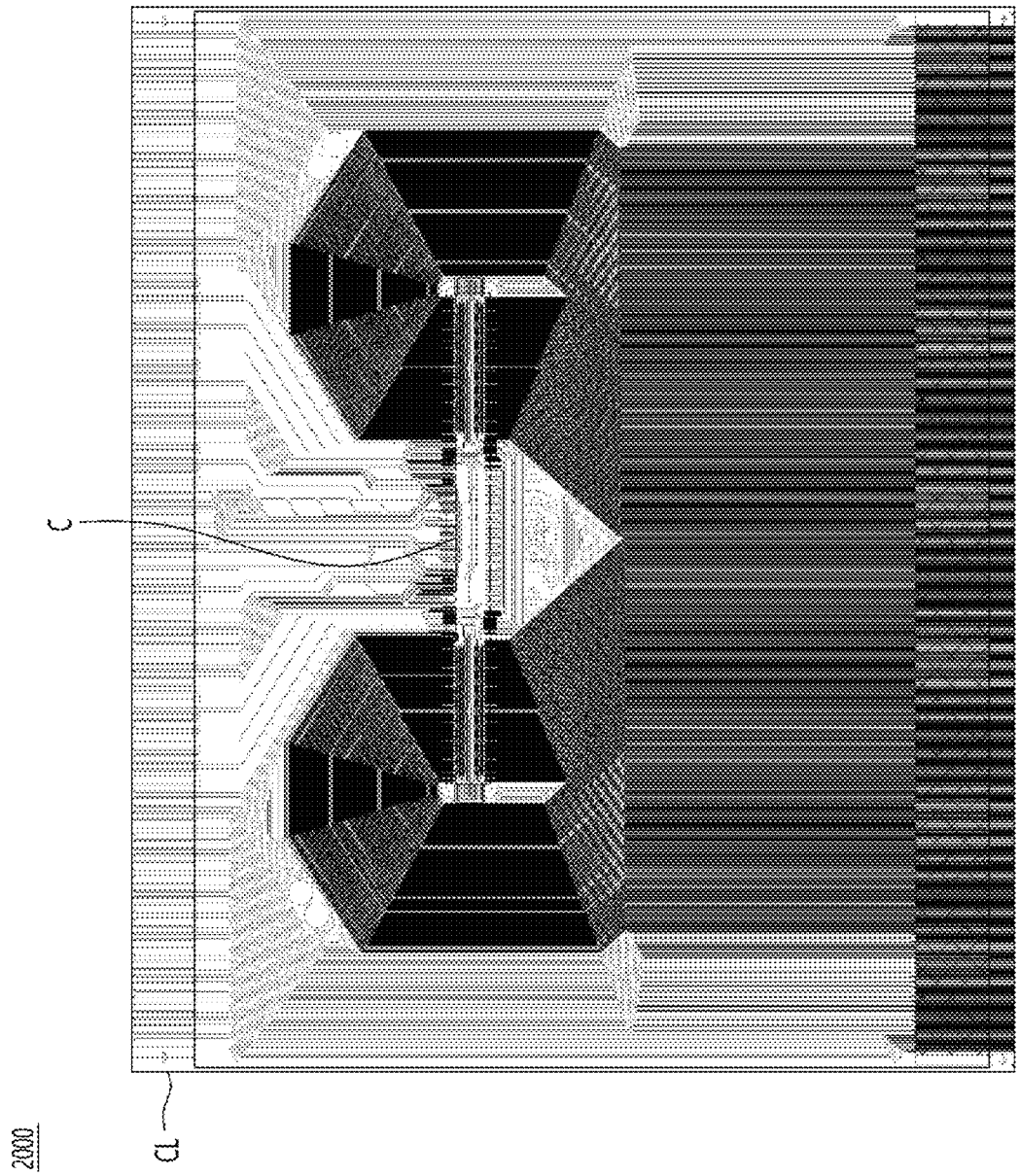
FIG. 14 is a top view of a COF module according to an embodiment.

FIG. 14 is a top view of a COF module according to the embodiment.

Referring to FIG. 14, the COF module according to the embodiment includes the flexible circuit board described above. Also, the COF module includes the chip C disposed in the chip mounting area CA.

In addition, the flexible circuit board 1000 includes the protective layer 300 described above.

The COF module may be manufactured by cutting the second region 2A of the flexible circuit board 1000 and mounting the chip C thereon. In detail, the cutting line CL may be cut and a driving chip electrically connected to the first circuit pattern and the second circuit pattern may be disposed in the chip mounting area of the flexible circuit board.

For example, after testing driving characteristics of the flexible circuit board through the pad part disposed outside the cutting line CL of the flexible circuit board, the flexible circuit board may be cut along the cutting line CL.

The COF module may be connected to the display panel and the circuit board and transmit electrical signals.

That is, the pad part of the first circuit pattern and the pad part of the second circuit pattern may be connected to the display panel, the circuit board, and the chip.

Figure 15:
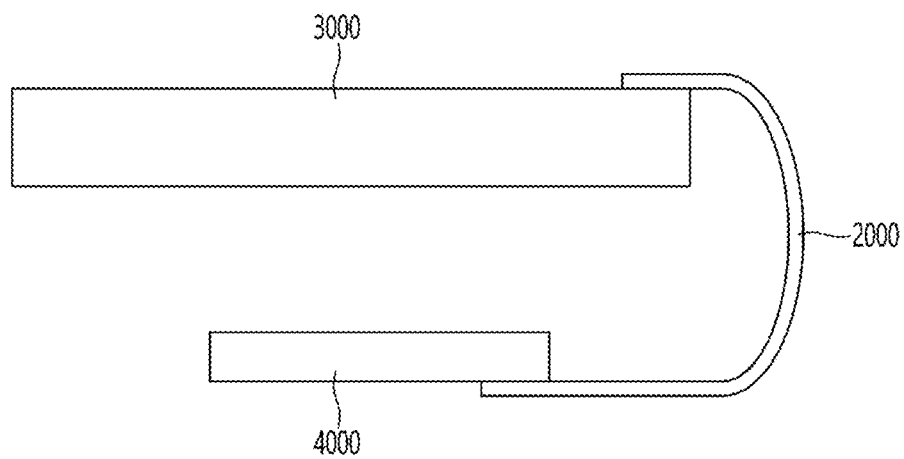
FIG. 15 is a cross-sectional view showing a connection relationship of the COF module including the flexible circuit board according to the embodiment.

Referring to FIG. 15, one end of a COF module 2000 including a flexible circuit board according to the embodiment is connected to the display panel 3000. In addition, the other end opposite to the one end may be connected to the circuit board 4000.

For example, one end of the COF module 2000 including the flexible circuit board according to the embodiment may be electrically connected to the display panel 3000. In addition, the other end opposite to the one end may be electrically connected to the circuit board 4000.

For example, an anisotropic conductive film may be disposed between the COF module 2000 and the circuit board 4000. The COF module 2000 and the circuit board 4000 may be electrically connected while being adhered by the anisotropic conductive film. The anisotropic conductive film is a resin in which conductive particles are dispersed. Accordingly, electrical signals of the circuit board 4000 may be transferred to the COF module 2000 through the conductive particles.

The COF module 1000 includes a flexible substrate. Accordingly, a rigid shape or a bent shape may be formed between the display panel 3000 and the circuit board 4000.

The COF module 2000 may connect the display panel 3000 and the circuit board 4000 facing each other in a bent form. Thus, the thickness of the electronic device can be reduced. In addition, design freedom can be improved. In addition, the COF module 2000 does not break wires even in a bent shape. Accordingly, reliability of an electronic device including the COF module may be improved.

Since the COF module is flexible, it can be used in various electronic devices.

Figure 16:
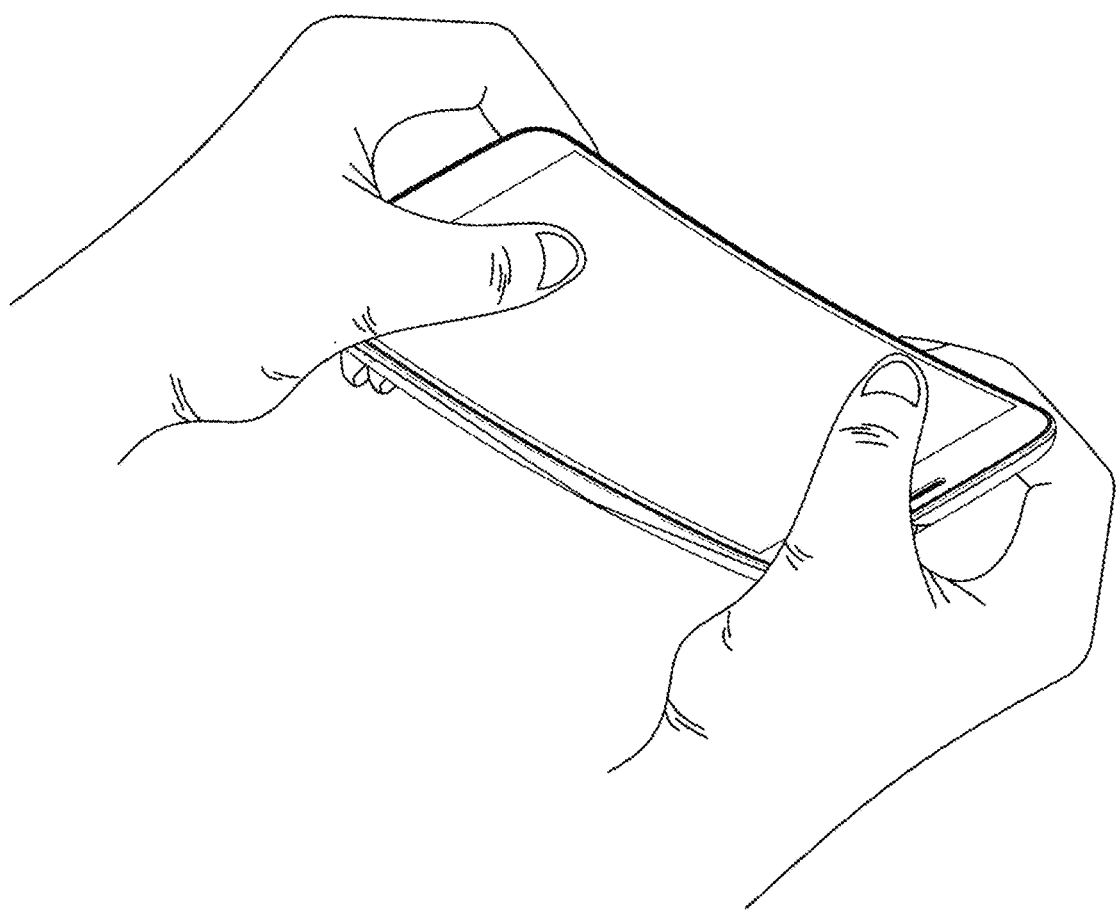
FIGS. 16 to 18 are views of an electronic device including the flexible circuit board according to the embodiment.

For example, referring to FIG. 16, the COF module may be included in a bendable flexible touch window. Therefore, the user can bend it by hand. Such a flexible touch window may be applied to a wearable touch.

Figure 17:
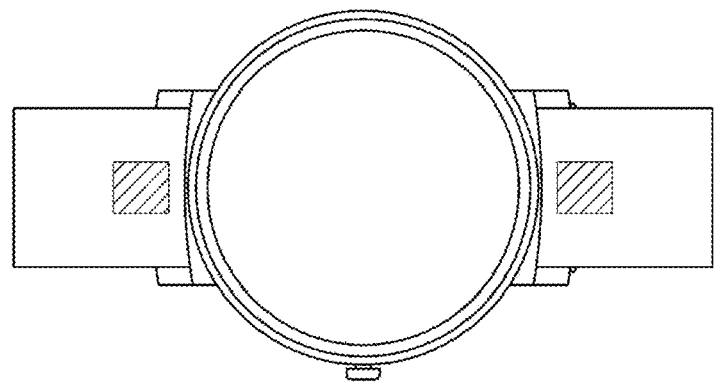

Referring to FIG. 17, the COF module may be included in various wearable touch devices including curved displays. Accordingly, the electronic device including the COF module may be thin and light.

Figure 18:
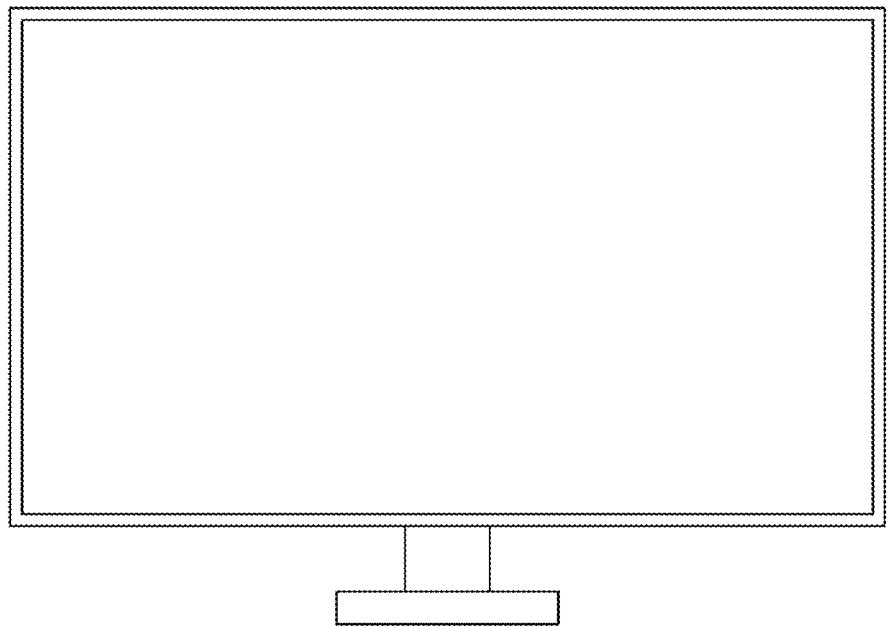

Referring to FIG. 18, the COF module can be used in various electronic devices having displays such as TV, monitors, and notebooks. In this case, the COF module may also be used in the electronic device having a curved display.

The characteristics, structures, effects, and the like described in the above-described embodiments are included in at least one embodiment of the present invention, but are not limited to only one embodiment. Furthermore, the characteristic, structure, and effect illustrated in each embodiment may be combined or modified for other embodiments by a person skilled in the art.

Accordingly, it is to be understood that such combination and modification are included in the scope of the present invention.

In addition, embodiments are mostly described above, but the embodiments are merely examples and do not limit the present invention, and a person skilled in the art may appreciate that several variations and applications not presented above may be made without departing from the essential characteristic of embodiments. For example, each component specifically represented in the embodiments may be varied. In addition, it should be construed that differences related to such a variation and such an application are included in the scope of the present invention defined in the following claims.

The invention claimed is:

1. A flexible circuit board comprising:
   a substrate on which a chip mounting area is defined;
   a circuit pattern disposed on the substrate; and
   a protective layer on the circuit pattern,
   wherein the circuit pattern includes a plurality of first circuit patterns, a plurality of second circuit patterns, and a plurality of dummy patterns,
   wherein each first circuit pattern includes a first pad part, a second pad part, and a first wiring part connected to the first pad part and the second pad part,
   wherein each second circuit pattern includes a third pad part, a fourth pad part, and a second wiring part connected to the third pad part and the fourth pad part,
   wherein a through hole is disposed in an inner region of each first circuit pattern.

2. The flexible circuit board of claim 1,
   wherein each first circuit pattern includes a 1-1 circuit pattern in which the through hole is disposed in an inner area and a 1-2 circuit pattern in which the through hole is not disposed in the inner area.

3. The flexible circuit board of claim 2, wherein a line width of the 1-1 circuit pattern is larger than a line width of the 1-2 circuit pattern.

4. The flexible circuit board of claim 2, wherein the number of first pad parts connected to the 1-1 circuit pattern is greater than the number of first pad parts connected to the 1-2 circuit pattern.

5. The flexible circuit board of claim 2, wherein the 1-1 circuit pattern is connected to a plurality of first pad parts.

6. The flexible circuit board of claim 2, wherein the 1-1 circuit pattern includes a first area and a second area having different widths,
   wherein a width of the first region is greater than a width of the width of the second region,
   wherein a size of the through hole disposed in the first region is greater than a size of the through hole disposed in the second region.

7. The flexible circuit board of claim 2, wherein the 1-1 circuit pattern includes a first area and a second area having different widths,
   wherein a width of the first region is greater than a width of the second region,
   wherein a number of through holes per unit length of the first region is greater than a number of through holes per unit length of the second region.

8. The flexible circuit board of claim 2, wherein the 1-1 circuit pattern includes a first area and a second area having different widths,
wherein a width of the first region is greater than a width of the second region,
wherein an area of the through hole per unit length of the first region is greater than an area of the through hole per unit length of the second region.

9. The flexible circuit board of claim 2, wherein the first circuit patterns are spaced apart at a first interval and a second interval,
wherein the first interval is greater than the second interval,
wherein the through hole is disposed on the second interval.

10. The flexible circuit board of claim 9, wherein the first interval is defined as an interval of first circuit patterns extending from the second pad part in one direction toward the first pad part,
wherein the second interval is defined as an interval of first circuit patterns that are bent in one direction and extend in another direction.

11. The flexible circuit board of claim 6, wherein the first circuit patterns are spaced apart at a first interval and a second interval,
wherein the first interval is greater than the second interval,
wherein the through hole is disposed on the second interval,
wherein sizes of the through holes formed in the first area, the second area, and the second interval are different from each other.

12. The flexible circuit board of claim 11, wherein the first interval is defined as an interval of first circuit patterns extending from the second pad part in one direction toward the first pad part,
wherein the second interval is defined as an interval of first circuit patterns that are bent in one direction and extend in another direction.

13. The flexible circuit board of claim 11, wherein a size of the through hole formed in the first area is greater than a size of the through hole formed in the second area and a size of the through hole formed in the second interval.

14. The flexible circuit board of claim 11, wherein a size of the through hole formed in the second region is equal to or greater than a size of the through hole formed in the second interval.

15. The flexible circuit board of claim 1, comprising a conductive layer disposed inside the through hole.

16. The flexible circuit board of claim 1, wherein an inside of the through hole is empty,
wherein side surfaces of the substrate, the circuit pattern, and the protective layer are exposed by the through hole.

17. The flexible circuit board of claim 1, comprising a conductive layer disposed inside the through hole; and a metal layer disposed under the substrate,
wherein the metal layer is in contact with the conductive layer.

18. The flexible circuit board of claim 17, wherein the metal layer is disposed at a position overlapping the through hole.

19. A COF module comprising:
a flexible circuit board according to claim 18; and
a chip disposed in the chip mounting area.

20. An electronic device comprising:
a COF module according to claim 19;
a circuit board connected to the first circuit pattern; and
a display panel connected to the second circuit pattern.

* * * * *